United States Patent [19]

Seales

[11] 3,842,490

[45] Oct. 22, 1974

[54] SEMICONDUCTOR STRUCTURE WITH SLOPED SIDE WALLS AND METHOD

[75] Inventor: Alan Seales, San Jose, Calif.

[73] Assignee: Signetics Corporation, Sunnyvale, Calif.

[22] Filed: Jan. 15, 1973

[21] Appl. No.: 323,904

Related U.S. Application Data

[63] Continuation of Ser. No. 135,893, April 21, 1971, abandoned.

[52] U.S. Cl. .......... 29/578, 29/580, 29/590
[51] Int. Cl. .......... B01j 17/00
[58] Field of Search .......... 29/578, 580, 590

[56] References Cited

UNITED STATES PATENTS

| | | | |
|---|---|---|---|
| 3,226,613 | 12/1965 | Haenichen | 29/578 |
| 3,388,000 | 6/1968 | Waters | 29/578 |
| 3,507,716 | 4/1970 | Nishida | 29/578 |
| 3,519,504 | 7/1970 | Cuomo | 29/578 |
| 3,573,570 | 4/1971 | Fuller | 29/590 |
| 3,607,480 | 9/1971 | Harrap | 29/578 |

*Primary Examiner*—Roy Lake
*Assistant Examiner*—W. Tupman
*Attorney, Agent, or Firm*—Flehr, Hohbach, Test, Albritton & Herbert

[57] ABSTRACT

Semiconductor structure having a semiconductor body with a planar surface. At least one region having an impurity therein is formed in the body and extends to the surface. A layer of insulating material is provided on the surface. Openings are formed in the layer of insulating material and expose said surface. The openings are defined by inclined side walls which extend at an angle with respect to said surface of less than 70°. Contact means is carried by the surface and extends through the opening to form contact with the region. At least portions of the contact means have a slope which conforms generally to the slope of the side walls.

In the method, two materials are utilized in which one material has an appreciably higher etch rate than the other material so that a slope is provided on the material having the lower etch rate.

13 Claims, 18 Drawing Figures

PATENTED OCT 22 1974

3,842,490

SHEET 1 OF 2

INVENTOR.

Alan Seales

BY Flehr, Hohbach, Test, Albritton & Herbert

Attorneys

INVENTOR.
Alan Seales
BY Flehr, Hohbach, Test, Albritton & Herbert
Attorneys

SEMICONDUCTOR STRUCTURE WITH SLOPED SIDE WALLS AND METHOD

This is a Continuation of application Ser. No. 135,893, filed Apr. 21, 1971 and now abandoned.

BACKGROUND OF THE INVENTION

This invention relates to a semiconductor structure which is provided with sloped side walls to facilitate the making of good metal contacts and a method for fabricating the same. In the past in the fabrication of a semiconductor structure, it has been the practice to etch openings in the silicon dioxide layers covering the planar surface of a silicon semiconductor body to provide openings to make contact with impurity regions in the semiconductor body. Because these openings have been etched into the oxide, these openings have been defined by relatively steep or generally vertical side walls, as for example, side walls having an angle greater than 70° with respect to the surface. It has been the practice to evaporate a metal such as aluminum onto the surface of the silicon dioxide insulating layer and into the openings to provide the necessary contacts for the semiconductor structure. It has been found that these generally vertical side walls of the insulating layer and any other layers provided on the semiconductor structure are provided with nearly vertical side walls or vertical steps which have made it very difficult to obtain good reliable contacts in the openings. The principal cause for the relatively poor contacts which have been obtained has been that the steep side walls serve to shadow certain surfaces from the evaporation source so that only a very thin metal film is provided on the shadowed surfaces. This has been true even though very thick layers of metal have been deposited on the structure. It has been found that even though the metal becomes very thick, microcracks may be formed around the contact holes and other steps generally starting at the base of the step and extending up through the aluminum. Such a condition provides very thin metal through which the current must pass giving rise to a high current density and enhanced electromigration leading to failure of the semiconductor structure by an open circuit in a manner well known to those skilled in the art. There is, therefore, a need for a new and improved semiconductor structure and method for making the same.

SUMMARY OF THE INVENTION AND OBJECTS

The semiconductor structure consists of a semiconductor body having a planar surface. At least one region having an impurity therein is provided in the body and extends to the surface. A layer of insulating material is formed on the surface and an opening is formed in said layer of insulating material and exposes said surface. The opening is defined by inclined side walls extending at an angle of less than 70° with respect to the surface. Contact metallization is carried on the layer of insulating material and extends through the opening to make contact with said region. At least a portion of the contact metallization has a slope which conforms to the slope of the side walls defining the opening.

In the method for fabricating a semiconductor structure having sloping side walls, two layers of materials which have a different etch rate are superimposed with one of the layers having an etch rate which is significantly different from the etch rate of the other layer. A mask for the etch is provided over the two layers and has an opening therein so that an etchant can selectively attack both of the materials so that the material which has the higher etch rate is cut back beneath the mask and the other material which has a lower etch rate is also cut back beneath the mask but has an inclined side wall which joins a generally vertical side wall of the material which etches at the faster rate. The mask and the material which etches at the faster rate can then be selectively removed so that there is provided an opening in the first material which is defined by inclined side walls. Other materials such as contact metallization can then be applied by evaporation to the surface of the first material and into the opening formed by the first material so that there is good covering of the side wall defining the opening. This method is particularly useful in the formation of contact metallization in semiconductor structures.

In general, it is an object of the present invention to provide a semiconductor structure with sloped side walls and method for fabricating the same which makes it possible to obtain excellent contact metallization.

Another object of the invention is to provide a structure and method of the above character in which at least two different materials having different etch rates are utilized.

Another object of the invention is to provide a structure and method of the above character in which the two materials are arranged in layers with the material having the higher etch rate being the surface layer.

Another object of the invention is to provide a structure and method of the above character in which the angle of the slope may be varied by varying the etch rate of the surface layer.

Another object of the invention is to provide a structure and method of the above character in which the etch rate of the surface layer can be varied by changing the composition of the surface layer or by annealling the surface layer under certain conditions.

Another object of the invention is to provide a structure and method of the above character which can be provided to form slopes on metal edges.

Another object of the invention is to provide a structure and method of the above character which can be utilized in conjunction with a multi-layer metallization process.

Another object of the invention is to provide a semiconductor structure of the above character in which the reliability of the structure is substantially increased.

Another object of the invention is to provide a method or process of the above character which is applicable to the fabrication of structures other than semiconductor structures.

Another object of the invention is to provide a structure and method of the above character in which steps formed by masking operations are sloped so that they can be readily covered with metal.

Another object of the invention is to provide a structure and method of the above character in which the sloping steps ensure that the metal film will deposit without voids and microcracks.

Another object of the invention is to provide a structure and method of the above character in which vapor deposited dielectric layers can be deposited smoothly without beading.

Another object of the invention is to provide a structure and method of the above character particularly useful with multi-layer metallization in which the edges of the metal leads in the lower layers can be sloped in order to ensure smooth application of insulating layers over the leads and thus ensure good metal coverage in the succeeding conducting layers.

Additional objects and features of the invention will appear from the following description in which the preferred embodiments are set forth in conjunction with the accompanying drawing.

DESCRIPTION OF THE PREFERRED EMBODIMENTS

Figures 1, 2, 3, 4, 5, 6, 7, 8, 9, 10, 11:
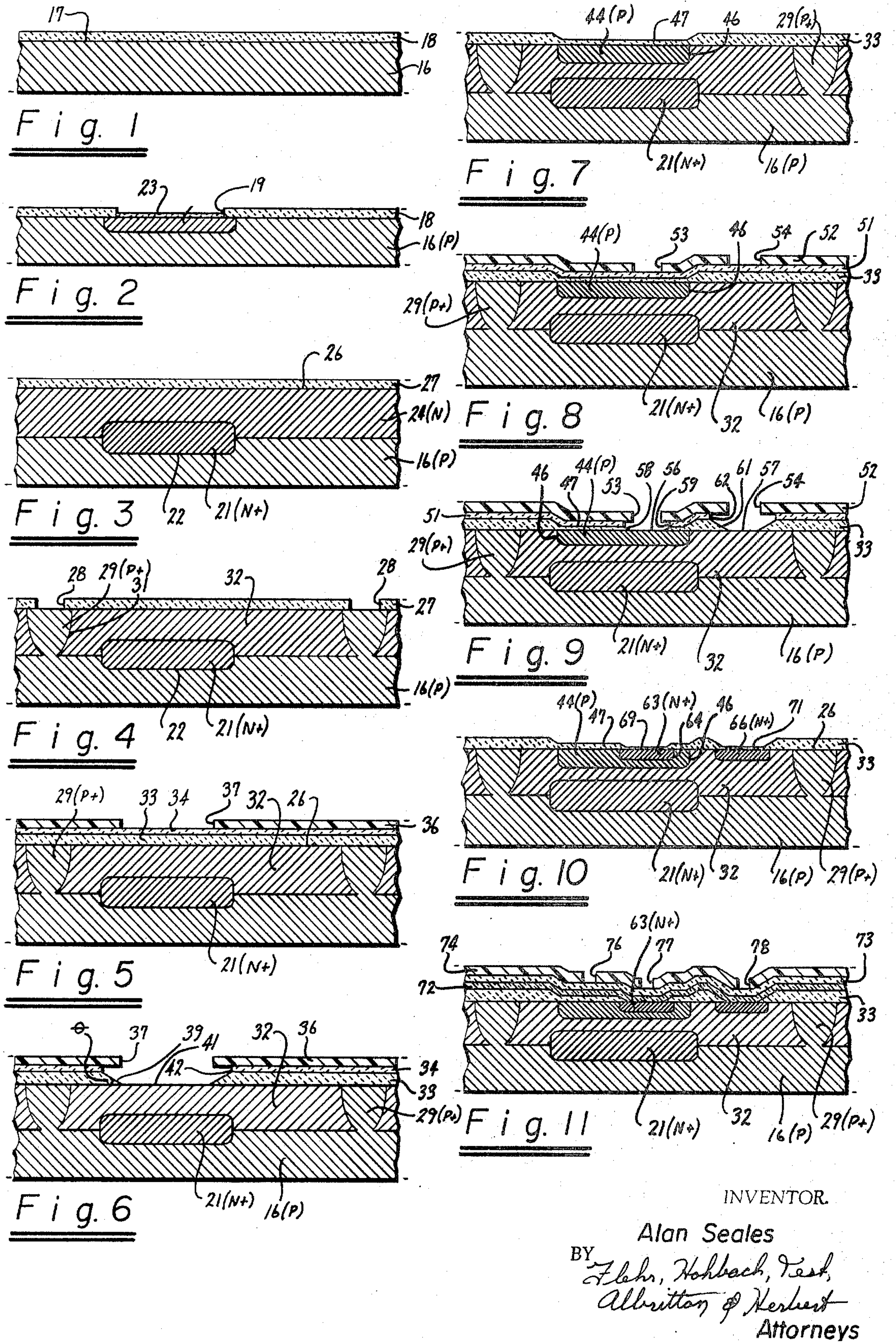
FIGS. 1 – 13 are partial cross-sectional views showing the steps for fabricating a semiconductor structure having sloped side walls that incorporate the present invention.

In fabricating the semiconductor structure incorporating the present invention, a semiconductor body 16 formed of a suitable material such as silicon is provided. This body can be without impurities or can be provided with a desired impurity as, for example, a P-type impurity. If the body is provided without impurities, the desired impurity can be diffused into the same. The body 16 is provided with a planar upper surface 17 which is covered with a masking layer 18 formed of a suitable material such as thermally grown silicon dioxide. This layer 18 is grown in a manner well known to those skilled in the art by placing the semiconductor body 16 which is in the form of a wafer in an oxidizing atmosphere at an elevated temperature.

Openings 19 are formed in the layer 18 by conventional photolithographic techniques to expose the surface 17. Thereafter, an N-type impurity is diffused through the openings 19 to provide N+ regions 21 defined by dish-shaped PN junctions which extend to the surface 17. This diffusion typically is a high concentration arsenic diffusion which is utilized to provide a buried layer of a type well known to those skilled in the art for the reduction of saturation resistance. A thin layer 23 of silicon dioxide grows within the opening 19 during the diffusion operation. After the diffusion of the N+ region 21 has been carried out, the silicon dioxide layers 18 and 23 are stripped off of the surface 17 in a conventional manner such as by the use of hydrofluoric acid.

An epitaxial layer 24 is then grown on the surface 17 with an impurity of the desired type as, for example, N-type. The method of growing such an epitaxial layer is well known to those skilled in the art. Typically, the epitaxial layer would be grown to a thickness of approximately 17 microns. During the epitaxial growth, the N+ region 21 would diffuse upwardly into the epitaxial layer 24 as well as downwardly into the semiconductor body 16. The epitaxial layer is provided with a planar upper surface 26 which is subsequently covered with a masking layer 27 formed of a suitable material such as thermally grown silicon dioxide. Openings 28 are formed in the layer 27 by conventional photolithographic techniques and thereafter a high concentration P-type diffusion is carried out to form P-type regions 29 defined by PN junctions 31 which extend all the way down to the P-type semiconductor body 16 so that the regions 29 provide junction isolation for the islands 32 which are surrounded by the same. It should be appreciated that, if desired, in conjunction with the present structure and method, other types of isolation can be utilized if desired. Thus, the structure and method are particularly adapted for use with dielectric isolation of the type described in copending application Ser. No. 391,704, filed Aug. 24, 1964. After the diffusion isolation has been carried out, the oxide layer 27 may be stripped by the use of a suitable etch such as hydrofluoric acid.

A layer 33 of a suitable insulating material such as thermally grown silicon dioxide is provided on the surface 26. This layer can be grown to a suitable thickness as, for example, 9200 Angstroms. The layer 33 is formed of a material which has a predetermined etch rate. Another layer 34 is formed above the layer 33 and is formed of a material which has a different etch rate from the etch for the material in layer 33. In the present embodiment, it is desirable that the etch rate be faster than for the material of layer 33. The layer 33 will serve as the base mask for the fabrication of a transistor as hereinbefore described. One material found to be very satisfactory for the second or surface layer 34 is vapor deposited silicon dioxide. This layer 34 is generally a relatively thin layer in comparison to the thickness of the layer 33. Silicon dioxide is deposited from the surface by the oxidation of silane with oxygen until the vapor deposited silicon dioxide has thickness ranging from 200 to 2,000 A. Particularly satisfactory results can be obtained with a thickness of 300 A. However, it has been found that this thickness can be varied within the range specified with very little difference in the final result. Thus, for example, the ratios of the thick layer 33 to the thin layer 34 can exceed a 100:1 ratio and certainly can be as little as a 1:1 ratio. The principal purpose of providing the layer 34 is to provide a layer on the surface of the bulk oxide 33 which will have a higher etch rate than the bulk oxide. A photoresist layer 36 is formed on the layer 34 in a manner well known to those skilled in the art. The photoresist is then exposed through a pattern and a suitable etch is utilized to form openings 37 in the photoresist to expose the layer 33. These openings will be utilized for hereinafter formed openings for a base diffusion step. At this time, additional openings (not shown) can be provided for diffused resistors and the like.

The semiconductor structure which is shown in FIG. 5 is then subjected to a suitable etch which, by way of example, can be a commercial buffered oxide etch. Normally, this is an HF/ammonium fluoride mixture. The etch is maintaind at a suitable temperature as, for example, 18° C. so that the etching operation will be accomplished in a relatively short time as, for example, approximately 15 minutes. The results of the etching operation are shown in FIG. 6. Initially, the etch attacks the vapor deposited layer 34 and removes the same down to the thermal oxide layer 33. Thereafter, the thermal oxide layer 33 is etched away at its normal etch rate which is approximately 640 Angstroms per minute. At the same time, the vapor deposited glass or silicon dioxide layer 34 is being etched away laterally at its normal etch rate which is approximately 2,500 A. per minute. The ratio of these two etch rates is approximately 4:1 which is the same gradient of the slope of the side walls 39 which define an opening 41 through which the surface 26 is exposed. This sloping side wall occurs because as the third layer 34 is etched away, progressive portions of the surface of the thermally grown oxide layer 33 are exposed. Since this is a relatively straight line function, the side walls 39 have a planar slope. The side walls 42 of the layer 34 are generally vertical as shown in FIG. 6. In other words, the profile of the cut in cross-section is a straight line. However, it should be pointed out that it has been found that at the bottom of the cut or opening 41, the profile of the cut or slope 39 differs slightly from the straight line in that the slope becomes less and less as the bottom of the recess or opening 41. The distance which the layer 34 is etched under the photoresist layer 36 can be seen by the portions of the photoresist which overhang the opening 41.

The angle theta shown in FIG. 6 is the angle between the profile or slope of the side walls 39 in cross-section and the surface 26. Mathematical analysis and measurement show the tangent of this angle to be equal to the etch rates of the two materials, i.e., the ratio of the etch rate of the thermally grown oxide to the etch rate of the deposited oxide. This can be expressed as follows:

$$\theta = \tan^{-1} \text{(etch rate of the bulk material)/(etch rate of the surface material)}$$

Figures 12, 13, 14A, 14B, 14C, 15, 16:
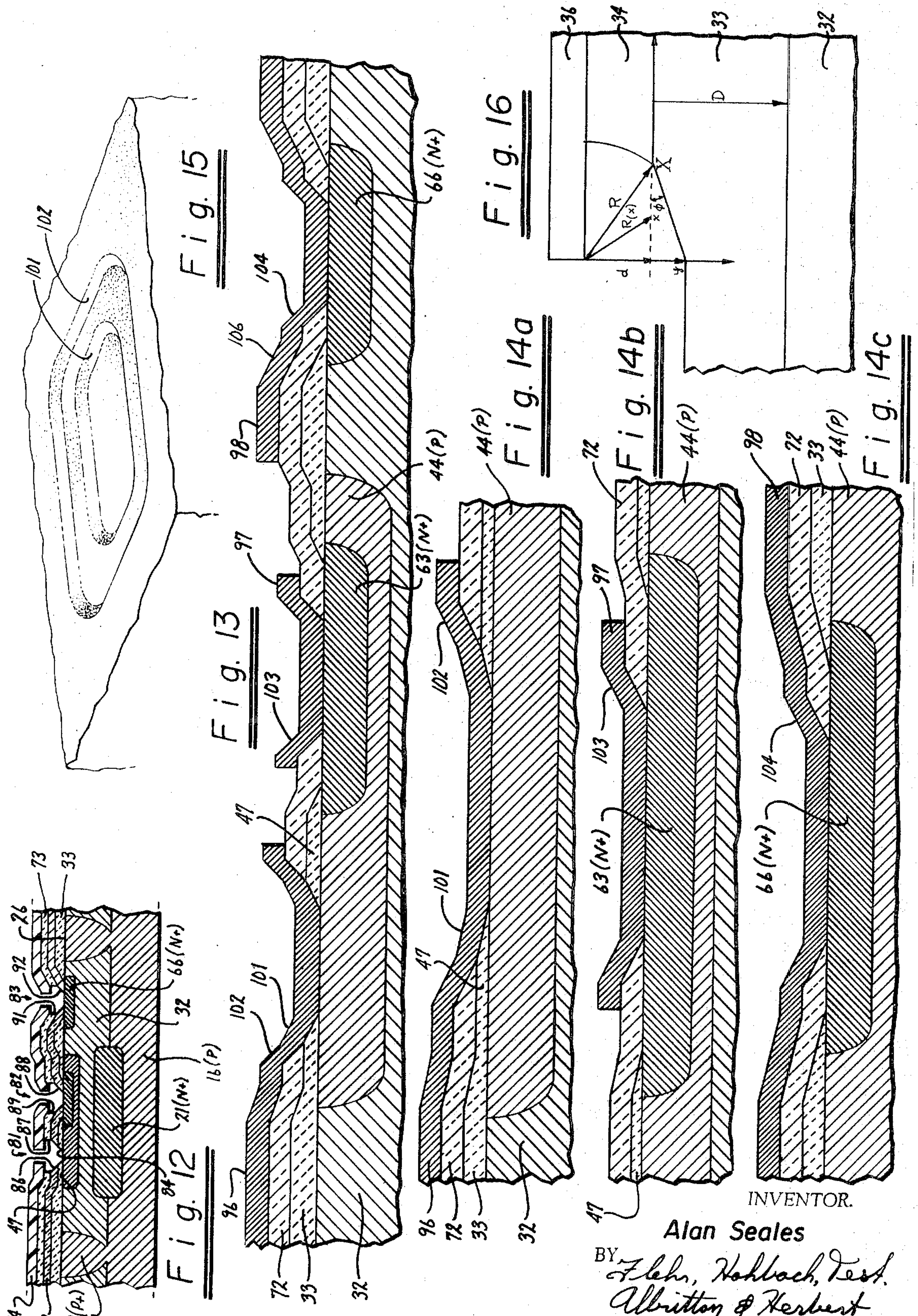
FIGS. 14*a*, 14*b* and 14*c* are enlarged cross-sectional views of portions of the structure shown in FIG. 13.
FIG. 15 is a partial plan view of a semiconductor structure incorporating the present invention.
FIG. 16 is a diagram used for mathematical purposes.

The mathematical analysis establishing this equation is set forth below in reference to FIG. 16. The diagram in FIG. 16 shows the etch front after a time, T. In the equation set forth below, the surface material, i.e., the material in layer 34, has a thickness $d$ and an etch rate of $E_1$. The bulk material which is the material in layer 33 has a thickness of D and an etch rate of $E_2$. For the purpose of this analysis, the following assumptions have been made:

1. Adhesion of the photoresist to the surface material is perfect.
2. The surface material etches away isotropically.
3. The bulk material etches in y direction only. At any value of x, depth y to which the bulk material is etched is given by $$y = E_2\, t$$

where $t$ is the length of time that the bulk material at $x$ has been exposed to the etch.

Now, $$\Delta t = T - R_{(x)}/E_1$$

But $$R_{(x)} = (x^2 + d^2)^{1/2} \text{ (Pythagoras)}$$

And $$T = R/E_1$$
$$= 1/E_1\, (X^2 + d^2)^{1/2}$$

So $$t\,\Delta = 1/E_1\, [(X^2 + d^2)^{1/2} - (x^2 + d^2)^{1/2}]$$

and $$y = E_2/E_1\, [(X^2 + d^2)^{1/2} - (x^2 + d^2)^{1/2}]$$

This gives the etch profile after any time, $T$.

For thin surface layers, $X >> d$ and so when $x >> d$, $$y = -E_2/E_1\, x + E_2/E_1\, X$$

which is an equation of a straight line of slope $-E_2/E_1$, i.e., $$\tan\theta = E_2/E_1$$

When etching is just complete, $y(0) = D$

So $$X = E_1 D/E_2$$

and $$y = D - E_2/E_1 x$$

From the foregoing mathematical treatment, it can be seen that the desired slope can be obtained by varying the etch rate for the surface layer by increasing the etch rate of the surface layer which can be accomplished by doping it with additional impurities such as phosphorus. Alternatively, if it is desired to decrease the slope, the surface glass layer can be doped with a suitable impurity such as boron, or it can be annealed to thereby reduce the etch rate and steepen the slope.

If no impurities are utilized in the deposited silicon dioxide, it has been found that a slope of approximately 14° is provided, i.e., one unit vertically for four units horizontally. In order to achieve the desired results of the present invention, however, it is preferable that the angle $\theta$ be no greater than 65°.

After the etching operation has been completed as shown in FIG. 6, the photoresist layer 36 is removed and thereafter the deposited $SiO_2$ layer 34 is removed by a suitable etch such as dilute HF. This etching step is controlled until all the vapor deposited layer 34 is removed. Very little of the thermally grown oxide layer 33 is removed.

As soon as the layers 36 and 34 have been removed, there remains the thermally grown oxide layer 33 with the sloping side walls 39 defining an opening 41. A base diffusion is carried out by diffusing P-type impurities through the openings 41 to form a P-type region 44 which is defined by a dish-shaped PN junction 46 that extends to the surface 26. During diffusion of the region 44, a thin oxide layer 47 grows in the opening 41. In addition, there is a slight additional growth of the thick oxide layer 33 which serves as a mask which is very small because of the thickness of the oxide layer. This is true because of the distance that the oxidizing species must travel to reach the silicon to oxidize it. In the region where the oxide layer 33 is very thin because of the slope of the side walls 39, the additional growth of the oxide is greater because the oxidizing species does not have to travel as far through the silicon dioxide to reach the silicon. It is for this reason that the slope of the side walls 39 is changed very slightly during the diffusion of the base region 44. The thickness of the regrown layer 47 approximates 4,200 A.

After the base diffusion has been completed as shown in FIG. 7, a layer 51 of silicon dioxide is deposited over the silicon dioxide layer 33 and the regrown oxide layer 47 in the opening 41 to a suitable thickness as, for example, 300 A. The same considerations apply to this layer 51 as with the deposited $SiO_2$ layer 34. Thus, the thickness of the layer 51 can be selected in the same manner as layer 34. The same considerations also apply to the type of material constituting the layer 34. After the layer 51 has been applied, a layer of photoresist 52 is applied and thereafter the photoresist is exposed through a mask and certain portions of the same are removed to provide openings 53 for the emitter contacts and openings 54 for the collector contacts to thereby expose the layer 51 below as shown in FIG. 8.

An etch of the type utilized in conjunction with the etching operation shown in FIG. 6 is utilized to provide windows or openings 56 and 57 for the emitter and collector contacts, respectively, to expose the surface 26. These openings 56 are formed by sloped side walls 58 which have the same slope as the side walls 39 for the same reasons as the side walls 39. For example, they can have a slope having a 1:4 ratio with one vertical unit for each four longitudinal units. As explained previously, this is determined by the ratio of the etch rates of the two materials forming the layers 33 and 51. The openings 59 are also defined by the vertical side walls 59 formed in the layer 51. The photoresist layer 52 overhangs the openings 56 as shown in FIG. 9. Similarly, the openings 57 are defined by sloped side walls 61 provided in the layer 33 and the generally vertical side walls formed in the layer 51. Similarly, the photoresist layer 52 overhangs the openings 57.

After the etching operation shown in FIG. 9 has been completed, the photoresist layer 52 is removed and the deposited silicon dioxide layer 51 is removed in the manner hereinbefore described for the layers 36 and 34 so that there remains the openings 56 and 57 which are defined by the sloped side walls 59 and 61 respectively. A suitable N-type impurity such as phosphorus is diffused through the openings 56 and 57. Thus, there are formed N+ regions 63 defined by diffused PN junctions 64 extending to the surface and being disposed within the regions 44 defined by the PN junctions 46. With respect to the openings 57, there are formed N+ collector contact regions 66 which are disposed within the N-type collector region 32. There is a slight regrowth of oxide in the openings 56 and 57 in the form of heavily doped silicon dioxide layers 69 and 71. These layers are doped with phosphorus and have a thickness of approximately 1,500 A. These relatively thin layers 69 and 71 are removed by a suitable etch such as HF so that the surface 26 is exposed through the openings 56 and 57. A layer 72 of phosphorus doped glass is then deposited on the silicon dioxide layer 33 in the openings 56 and 57. The use of this layer is not essential to the devices. However, it has been found that such a layer is useful for raising the inversion voltage of the devices. This P-type glass is deposited in a manner well known to those skilled in the art.

A layer 73 of deposited silicon dioxide is then formed on the layer 72. The same considerations apply to the formation of this layer 73 as with the layers 34 and 51. A layer 74 of photoresist is then formed over the layer 73. The photoresist is exposed through a suitable mask and portions of the photoresist are removed to provide base contact openings 76, emitter contact openings 77 and collector contact openings 78.

The glass contains phosphorus doping to provide a well known function in which the phosphorus serves as a getter for impurities such as sodium. After the formation of the P-type glass layer, certain annealing operations of a type well known to those skilled in the art can be performed to enhance the characteristic of the semiconductor devices which are to be formed.

Although there are only shown openings for making contacts to transistors, it should be appreciated that at the same time openings can be formed in the photoresist for making contact with other parts of an integrated circuit which are being formed on the semiconductor body as, for example, resistors, capacitors, diodes, etc.

An etch of the type hereinbefore described is then utilized to form openings 81, 82 and 83 which expose certain areas of the surface 26. The openings 81 are defined by sloping side walls 84 formed in the layers 47 and have the 4:1 slope previously described. The openings 81 are also formed by sloping side walls 86 formed in the P glass layer 72 and have a slope of approximately 2½ to 1 because the phosphorus doped glass has a faster etch rate then thermal oxide. It is for this reason that the slope or angle of the side walls 86 is greater than that of the side walls 84. The openings 81 are also defined by the vertical side walls 87 provided in the deposited silicon dioxide layer 73. Thus, it can be seen that the base contact openings 81 are defined by two different slopes in which the phosphorus doped glass etches with a slope of 2½ to 1 and the thermally grown silicon dioxide layer 47 etches with a 4:1 slope. This is a consequence of the fact that the etch rate of the phosphorus doped glass is intermediate between the etch rates of the undoped silicon dioxide and the thermally grown silicon dioxide.

The emitter contact openings 82 are defined by sloping side walls 88 and the phosphorus doped glass which, for reasons explained previously, have a slope of approximately 2½ to 1 and the vertical side walls 89 in the deposited silicon dioxide layer 73. Similarly, the collector contact openings 83 are defined by sloping side walls 92 provided in the phosphorus doped glass having a slope of 2½ to 1 and vertical side walls 91 provided in the deposited silicon dioxide layer.

The photoresist layer 74 and the deposited silicon dioxide layer 73 are then removed in the manner hereinbefore described so that there remains the openings 81, 82 and 83 in the layers 72 and 33. A layer of a suitable metal such as aluminum is then evaporated onto the surface of the layer 72 and into the openings 81, 82 and 83. The metal layer is then covered with a photoresist and the photoresist is exposed through a mask and thereafter certain portions of the photoresist are removed and then an etch is utilized which selectively attacks the metal layer to provide the contact elements 96, 97 and 98 which make contact with the base, emitter and collector regions of the transistor, respectively. It should be appreciated at the same time that other contacts for the other semiconductor devices including capacitors, resistors, diodes and the like forming a part of the integrated circuit are formed at the same time. Also the interconnections which form a circuit from these components are defined at this time.

From the contact elements shown in FIG. 13 and the enlargements thereof shown in FIGS. **14*a*, 14*b* and 14*c*, it can be seen that there is no thinning out of the metal over the edges of the side walls which define the openings 81, 82 and 83. This is because during evaporation of the metal, there is no significant shadowing of any of the areas which are to be covered by the metal steep, i.e., approaching the vertical, side walls or steps. The extent to which shadowing can occur from evaporation of the metal from a point source is dictated by the cosine of the angle of the slope which is to be coated with the metal. When the slope is less than 70°, there will be no shadowing of any of the areas from the vapor stream emanating from the metal source being evaporated. The slopes of the side walls defining the openings 81, 82 and 83 are in fact very gentle as can be seen from FIGS. 14***a*, 14*b* and 14*c* which are drawn to scale. The slopes in the preceding figures are distorted by a 2:1 ratio in the horizontal direction in order to conserve space in the drawing. FIG. 14*a* shows the base contact 96 which has two slopes, one slope 102 which is formed by the slope of the side wall of the deposited silicon dioxide or glass which is quite steep by comparison with the other slope 101 provided by the slope of the side wall in the thermally grown silicon dioxide. In FIG. 14*b*, it can be seen that the contact 97 is provided with a single slope 103 which is determined by the slope of the side wall formed in the phosphorus doped glass. The same is true with respect to the collector contact which is shown in FIG. 14*c* which is provided with a slope 104. However, it is also provided with a slope 106. The base contact is different from the emitter and collector contacts because it is the only one which is formed in the original thermally grown silicon dioxide.

In FIG. 15 there is shown a plan view of the base contact of an integrated circuit incorporating the present invention. In addition, other metallization (not shown) is provided which is connected to the contacts 96, 97 and 98 to form the same into a part of the integrated circuit. The circuit forms a part of an operational amplifier which is a linear integrated circuit. It has been found that integrated circuits constructed as herein described have excellent contact metallization. There is no significant thinning of the metallization which, in turn, eliminates high current densities in certain areas in the metallization which in the past has caused enhanced aluminum migration and finally interruption of the aluminum film.

Although the foregoing description of the invention has been in conjunction with the fabrication of a particular integrated circuit, namely, an operational amplifier, it can be readily appreciated that the structure and method can be utilized with all types of semiconductor structures such as bipolar and MOS since all need contact metallization. Also, it should be appreciated that the invention can be utilized in other fields. All that is required is that there be at least two materials which have different etch rates. More than two materials can be utilized having more than two different etch rates if such is described. The same approach can be used for forming dual level metallization in integrated circuits. In FIG. 13 it can be seen that there is in fact provided a three-layer structure consisting of deposited silicon dioxide, deposited phosphorus doped glass and thermally grown silicon dioxide in the vicinity of the base contact region. The top layer has the highest etch rate, the bottom layer the lowest etch rate, and the middle layer has an etch rate which is between the etch rates of the top and bottom layers. It can be seen that this will provide a gradation in the slopes from the top to the bottom as represented by the base contact opening 81. It can be seen that it would be possible to provide a structure in which the etch rates were reversed and in which there would be undercutting of one layer below the other which would be particularly undesirable in conjunction with contact metallization because shadowing would occur. However, in certain other applications of the invention, it might be desirable to provide a profile of this nature.

I claim:

1. In a method for fabricating a structure on a surface of a semiconductor body of one conductivity type, providing a first layer of a first material having a first etch rate on the surface of the body, providing a second layer of a second material having a second etch rate on said first layer, forming an etch resistant mask over said second layer having a pattern of openings therein exposing areas of said second layer through said openings, applying an etch through said openings which attacks said first and second materials to form openings in said first layer exposing the surface of the semiconductor body and so that said openings are defined by side walls in the first layer having an angle of less than 70° with respect to said surface, removing said mask and said second layer of said second material, forming through at least one of said openings on said first layer a region of opposite conductivity type in said semiconductor body to thereby produce a PN junction in said semiconductor body and forming contact metallization in said openings and on said sloped side walls adjacent to said one opening whereby the thickness of the metallization is relatively uniform throughout.

2. A method as in claim 1 wherein the semiconductor body is formed of silicon, the first material is provided by thermally growing silicon dioxide and the second material is provided by vapor depositing silicon dioxide.

3. A method as in claim 2 wherein the vapor deposited oxide is grown to a thickness ranging from 200 to 2,000 A.

4. A method as in claim 1 wherein a desired slope can be obtained by varying the etch rate for the second material by doping the second material with impurities.

5. A method as in claim 1 wherein a desired slope can be obtained by doping the first named layer with an impurity.

6. A method as in claim 1 wherein the desired slope can be obtained by annealing the first layer of material after it has been formed.

7. A method as in claim 1 wherein said first material has an etch rate which is substantially less than the etch rate for the second material whereby in the formation of said openings, said second layer is etched away beneath said mask to form generally vertical side walls and wherein the side walls in the first layer extend downwardly and inwardly with respect to the surface.

8. A method as in claim 1 together with the step of forming a doped glass on said first layer after the openings have been formed in the first layer and extending into said openings, forming an additional layer of said second material on said doped glass, forming an etch resistant additional mask on said additional layer of said second material having a pattern of openings therein exposing said additional layer of said second material, applying an etch through the openings in the additional mask which attacks the first and second materials to form openings extending through said additional layer of said second material and through said doped glass and said first layer which are defined by side walls in said additional layer, said doped glass and said first layer extending at an angle of less than 70° with respect to said surface and removing said additional mask and said additional layer of said second material and wherein said metallization extends through the additional openings.

9. In a method for fabricating a structure on the surface of a semiconductor body of one conductivity type, providing a first layer of a first material having a first etch rate on the surface of the body, providing a second layer of a second material having a second etch rate on said first layer, forming an etch resistant mask over said second layer having a pattern of openings therein exposing areas of said second layer through said openings, applying an etch through said openings which attacks said first and second materials to form openings in said first layer exposing the surface of the support body so that said openings are defined by side walls in the first layer at an angle of less than 70° with respect to said surface, removing said mask and said second layer of said second material, forming through at least one of said openings in said first layer a region of opposite conductivity in said semiconductor body to thereby produce a PN junction in said semiconductor body, forming a first additional layer of said second material upon said first layer, forming an additional mask on said first additional layer of said second material, providing additional openings in said additional mask in accordance with a predetermined pattern, applying an etch through said additional openings in said additional mask to form openings extending through said first additional layer of said second material and said first layer and exposing said surface, removing said additional mask and said additional layer of said second material, forming through at least one of said last named openings in said first layer a region of said one conductivity type, forming a second additional layer of said second material on said first layer of insulating material and extending into said last named openings, forming a second additional mask on said second additional layer of said second material having a pattern of openings therein, applying an etch through said last named pattern of openings to form contact openings extending through said second additional layer and through said first layer and so that the contact openings are defined by sloping side walls in the first layer having an angle less than 70° with respect to said surface, removing said second additional mask and said second additional layer of said second material and forming contact metallization extending through said contact openings to make contact with said semiconductor body and covering said side walls defining said contact openings so that the metallization has a relatively uniform thickness throughout.

10. A method as in claim 9 wherein prior to the formation of the second additional layer of said second material, a layer of doped glass is formed on said first layer.

11. A method as in claim 9 wherein said first material has an etch rate which is substantially less than the etch rate for the second material whereby in the formation of said openings, said second layer is etched away beneath said mask to form generally vertical side walls and wherein said side walls forming the openings in said first layer extend downwardly and inwardly with respect to said surface.

12. A method as in claim 9 wherein the first material is provided by thermally growing the same and wherein the second material is provided by vapor depositing the same.

13. A method as in claim 12 wherein the first and second materials are silicon dioxide.

* * * * *